United States Patent [19]

Riecke

[11] 4,362,945
[45] Dec. 7, 1982

[54] CHROMATICALLY CORRECTED DEFLECTING DEVICE FOR PARTICLE-BEAM EQUIPMENT

[75] Inventor: Wolfgang D. Riecke, Baden-Baden, Fed. Rep. of Germany

[73] Assignee: Fraunhofer-Gesellschaft Zur Förderung der angewandten Forschung e.v., Munich, Fed. Rep. of Germany

[21] Appl. No.: 179,398

[22] Filed: Aug. 19, 1980

[30] Foreign Application Priority Data

Sep. 13, 1979 [DE] Fed. Rep. of Germany ....... 2937004

[51] Int. Cl.$^3$ .............................................. H01J 3/26
[52] U.S. Cl. .......................... 250/396 R; 250/396 ML
[58] Field of Search ........... 250/396 R, 396 ML, 398, 250/296, 311; 313/361.1

[56] References Cited

U.S. PATENT DOCUMENTS 3,319,110  5/1967  Schlesinger ......................... 313/389
4,335,309  6/1982  Anger et al. ........................ 250/398

OTHER PUBLICATIONS

Kel'man et al., "Achromatic Quadrupole Electron Lenses", Soviet Physics-Tech. Phys., 6 (12), Jun. 1962, pp. 1052-1054.

*Primary Examiner*—Eugene La Roche
*Assistant Examiner*—Carolyn E. Fields
*Attorney, Agent, or Firm*—John C. Smith, Jr.

[57] ABSTRACT

A chromatically corrected deflecting device for particle-beam equipment, particularly electron-beam equipment, comprises an electric deflecting field and a magnetic deflecting field which are simultaneously employed for the deflection of a beam. The two deflecting fields are normal to each other and are oriented relative to each other in such a manner that the beam deflections due to the associated deflecting fields occur in one and the same plane, i.e. in the plane containing the undeflected beam. The electric deflection is at the same time directed in opposition to the magnetic deflection. The ratio of the magnitude of the electric deflection angle to the magnitude of the magnetic deflection angle remains at a constant value which is independent of the resulting total deflection angle and is chosen such that the chromatic aberrations affecting the deflections due to the individual fields exactly compensate each other with reference to their effect on the beam position in the working plane, the constant value of the ratio of the magnitudes of the deflection angles being uniquely determinable as a function of at least one of the distance of the deflecting fields from the working plane, and the energy and rest mass of the particles to be deflected by particle-optical means.

7 Claims, 8 Drawing Figures

CHROMATICALLY CORRECTED DEFLECTING DEVICE FOR PARTICLE-BEAM EQUIPMENT

BACKGROUND OF THE INVENTION

This invention relates to particle-optical equipment for the irradiation of the surface of a solid material in massive form, or for the irradiation of a thin layer which can be penetrated by the radiation, both being described as the specimen or specimen surface in the following text. In this context, the invention relates particularly to those types of particle-optical equipment which are intended to apply an irradiation dose over a zone of the specimen surface which is large in comparison to the beam diameter and this surface zone may, for example, have a rectangular shape. To achieve this, it is essential that the beam be deflected from its original path and passed across the surface to be irradiated, by means of deflecting fields.

Such types of particle-optical equipment are, for example, employed in the production of highly integrated semiconductor circuits, most particularly when the dimensions of the circuit details approach, as the scale of integration is increased, the order of magnitude of the wavelength of light and, due to the unavoidable diffraction of light, photolithographic processes encounter their limit. Electron-beam lithography represents such a possibility of producing still finer structures. With this particle-optical process, the wavelength is so short that diffraction can, for practical purposes, be ignored when recording the structure details. So that both the special doping of the extremely finely structured regions of the semiconductor surface layer can be effected and the connecting conducting tracks can be produced, it is important, in the case of electron-beam lithography, to restrict the electron irradiation to the surface regions that are to be exposed, particularly concerning not only the dimensions and form of these regions but also their precise position on the semiconductor wafer. For this purpose, the places to be exposed, in the form of a closely spaced raster, are swept by a very fine focussed electron beam.

All of the locations to be irradiated lie in or in close proximity to a common plane which is oriented perpendicular to the axis of the electron beam irradiation instrument. This common plane is called the working plane.

The above procedure creates very onerous requirements with regard to precise adherence to the deflection angle necessary at any instant, according to which angle the electron beam is aimed at the places on the specimen surface to be irradiated. One of the problems occurring in this connection is caused by the chromatic aberrations of the deflection systems. Thus, if the deflecting magnetic field or the deflecting electric field is held constant, the deflection angle decreases as the velocity and energy of the particles increase. If the particle beam contains a finite range of energies, even if its energy spread is small compared with the beam energy, the deflection angle will accordingly extend over a correspondingly finite range. Analogously, the impact point of the particle beam, in the working plane or on the luminescent screen, will be deformed into a short line, lying in the direction of the deflection. In the case of electron-beam lithography machines, this effect leads, for example, to an increase in the width of the exposed lines and thereby leads to a limitation of the particle-optical performance capability, namely to a reduction in the resolving power, this reduction becoming particularly noticeable in the case of line widths below 1 μm.

Now, it is usual up to the present to employ either exclusively magnetic or exclusively electric deflection systems, the decision in favor of one of the deflecting fields not normally being conditioned by electron-optical considerations alone, but by other technical factors often playing an important part, such as, for example, the availability of space, or the capability, with regard to the deflection system electric power supply, to handle signals in rapid sequence. For this reason, electric and magnetic deflection systems have also been employed simultaneously in some cases, in which the intrinsically slower magnetic deflection system provided the main part of the desired deflection, whilst a comparatively small but rapid electric deflection effected the fine-positioning of the beam with a high point sequence frequency. In these cases, the electric deflection, which typically equals only a few percent of the magnetic deflection, can be directed in the same sense as the magnetic deflection, or in opposition to it, and the two deflection angles do not remain in a fixed mutual relationship, either with regard to their directions or their magnitudes, which factor is, however, characteristic of the present invention.

SUMMARY OF THE INVENTION

The object of the present invention is now to eliminate the chromatic aberration of the deflection, or at least to reduce it drastically.

According to the present invention, the deflection is here effected by means of the simultaneous use of crossed, namely mutually normal, magnetic and electric deflecting fields, the orientation of the field intensities being fixed in such a manner that the magnetic deflection and the electric deflection are directed in mutual opposition and the magnitudes of the deflections, and hence the field intensities, being chosen such that no displacement of the beam impact point occurs in the working plane in the event of a change in the energy of the particle beam.

BRIEF DESCRIPTION OF THE DRAWINGS

Embodiments of the invention will now be described by way of example and with reference to the accompanying schematic drawings in which.

DESCRIPTION OF THE PREFERRED EMBODIMENTS

Figure 1:
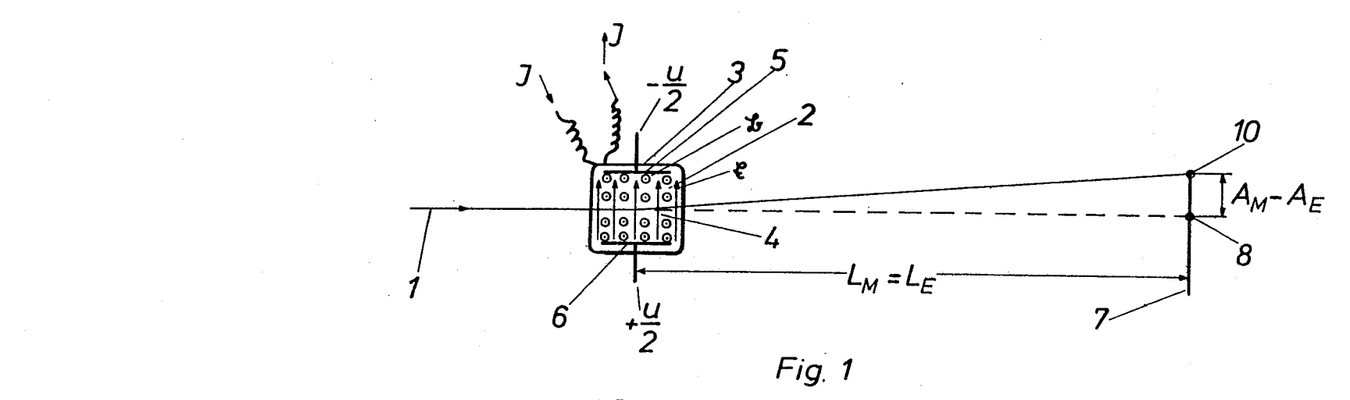
FIG. 1 shows an arrangement with superposed deflection systems.
Figure 2:
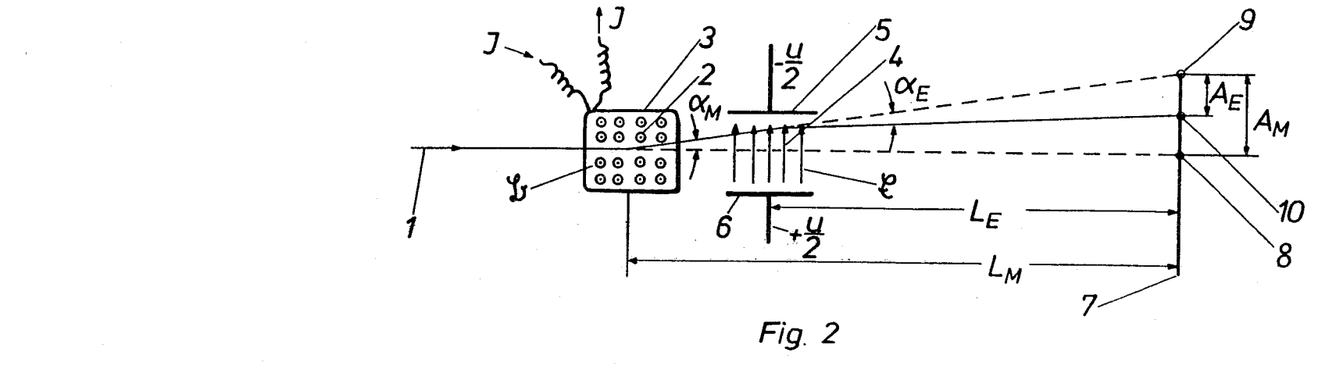
FIGS. 2 and 3 show separate deflection systems.
Figure 3:
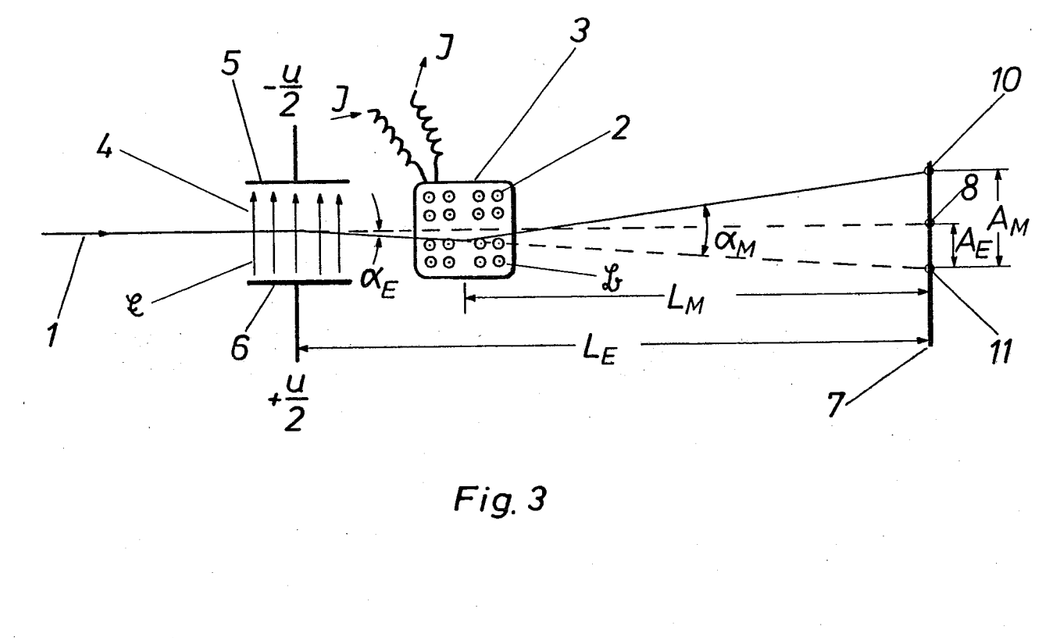

FIGS. 1 to 3 show the arrangement of a deflection system for electron beams, this system being corrected with respect to the chromatic aberration.

In this regard, the electric and the magnetic deflecting fields do not need to be superposed precisely, as shown in FIG. 1, they can also be arranged behind one another in the beam direction. Thus, in FIG. 2, the magnetic deflection is effected first, followed by the electric deflection, whilst in FIG. 3 the electric deflection is effected first, and then the magnetic deflection.

In detail, the reference numeral 1 designates an incident particle beam (electron beam), which is directed in the direction of the extrapolated axis represented by a broken line, along which axis the beam tends to run in the absence of any deflection. A magnetic deflecting field 2 is arranged normal to the plane of the drawing in the example and is generated, in a manner known per se, by means of two coils 3, which, in the case of FIGS. 1 to 3, are to be considered as being positioned over and beneath the plane of the drawing, so that they generate a magnetic field $\mathcal{L}$ at the beam location when current J flows through them. In a corresponding manner, also known per se, an electric deflecting field 4 is generated by means of two deflecting plates 5 and 6, which stand normal to the plane of the drawing in FIGS. 1 to 3 and to which electrical potentials $-(u/2)$ and $+(u/2)$, with respect to the equipment wall, are applied in the manner indicated. In this technique, which is also well-known, for generating the deflecting field, the beam moves in close proximity to the median plane of the deflecting field, is at a potential practically equal to that of the equipment wall, namely the potential of the anode, and varies its velocity in no more than an insignificant manner on passing through the deflecting field.

It has long been well-known that, under these conditions, the deflection angle produced by an electric deflecting field can be described by means of the following formula:

$$\alpha_E = \tfrac{1}{2}(1/d)(u/U)$$

Figure 4:
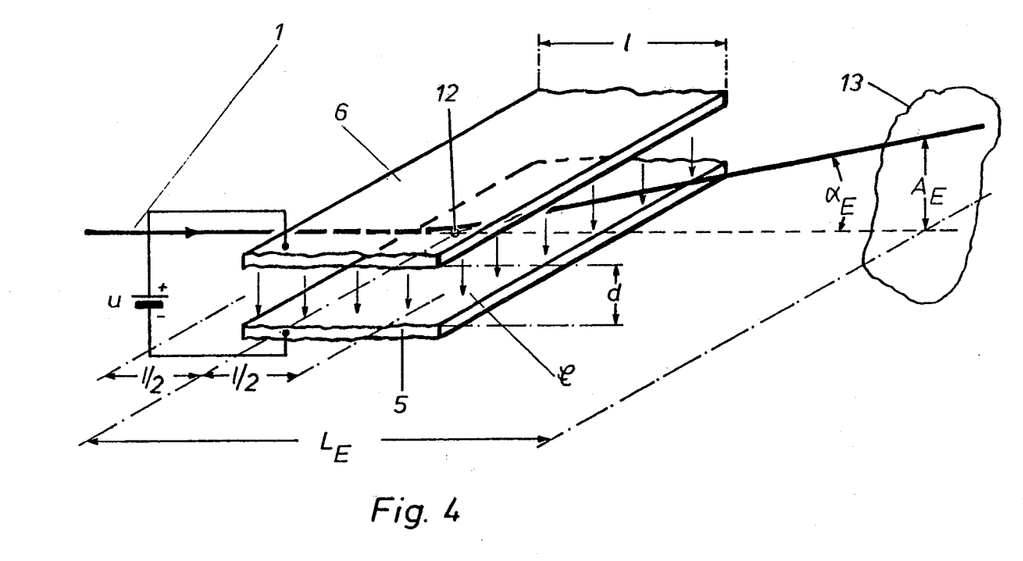
FIG. 4 shows an electric deflection system according to the known state of the art and is used to define some design parameters.

The deflection angle is here expressed in radians. U is the acceleration voltage of the particle beam and u is the voltage between the deflecting plates 5 and 6. The length of the deflecting plates 5 and 6, measured in the beam direction, is denoted by 1, whilst d denotes their mutual separation. For clarity, these design parameters are shown separately in FIG. 4. To an observer standing behind the deflection system and looking back against the beam direction, it thereby appears that the electron beam 1 had traversed half of the deflecting field, along the path length $\tfrac{1}{2}$, without being affected, before having been bent (at point 12) sharply through an angle $\alpha_E$. In a plane 13, which lies normal to the undeflected electron-beam direction at a distance $L_E$ from this (virtual) beam bend-point 12, the electron beam is accordingly displaced by the distance $$A_E = \alpha_E \cdot L_E$$

The formulae for $\alpha_E$ and $A_E$ are valid for all particle beams, not just for electrons. In the case of a magnetic deflecting system, the deflection angle can also be calculated with the aid of a formula which has been known for a long time, which states, for particles having the rest mass $m_o$:

$$\alpha_M = \mu_o \sqrt{\frac{e}{2m_o}} \frac{NJ}{\sqrt{U}} \frac{h}{b}$$

Figure 5:
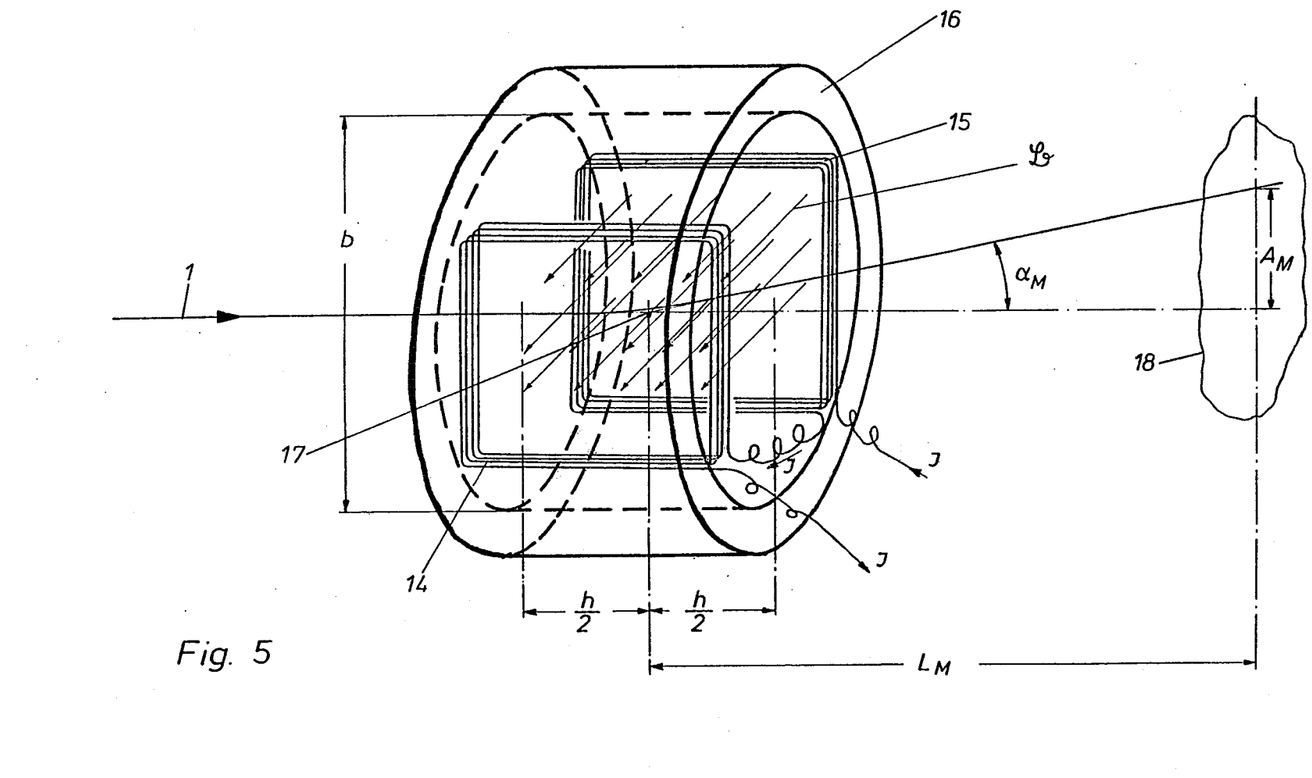
FIG. 5 shows a magnetic deflection system according to the known state of the art and is used to define some design parameters.

The deflection angle $\alpha_M$ is again found to be expressed in radians, and U is again the acceleration voltage of the particle beam 1. $\mu_o = 4\pi \times 10^{-7}$ Vsec/A×m is the permeability of vacuum, $e = 1,602 \times 10^{-19}$ Asec is the elementary electronic charge and, specifically for electrons, the rest mass $m_o = 9.1085 \times 10^{-31}$ kg. The magnetic deflecting field, having the flux density (induction) $\mathcal{L}$ is assumed to be generated here by two coils 14 and 15, which are to be considered as being positioned, in pairs, in front of and behind the plane of the drawing in FIGS. 1 to 3. To facilitate visualization, the location of these coils relative to the electron beam 1 is shown separately in FIG. 5. In this arrangement, the coils must extend by the amount h, seen in the beam direction, and their stray magnetic field should be absorbed by a magnetically highly-permeable short-circuiting ring 16, of the diameter b, and thus be short-circuited. In the above formula for $\alpha_M$, N denotes the total number of turns on both coils together so that N/2 turns are alloted to each coil in the case of a symmetrical assembly, a current J flowing in these turns. To an observer in the beam direction, standing behind the system, the particle-optical effect of the magnetic deflecting system appears, analogously to the conditions present in the electric deflecting field, such that the particle beam 1 would initially traverse half of the magnetic field, along the path length h/2, without being affected, in order then to be bent (virtually) through the angle $\alpha_M$, at a point 17, which lies in the median plane of the field. (As in the case of the electric deflecting field, the deflection of course occurs gradually in actual practice). The impact point of this beam in plane 18, which stands normal to the direction of the undeflected particle beam and may be located at the distance $L_M$ from the virtual bending point 17 of the particle beam, is displaced by the distance $$A_M = \alpha_M \cdot L_M$$

If the magnetic and electric deflecting fields are now superposed in the manner shown in FIG. 1 and, moreover, in such a way that the "virtual" beam bending points of the individual fields coincide ($L_M = L_E = L$), and if, furthermore, the polarities of the magnetic and of the electric deflecting field are chosen so that the individual deflections caused by the two fields substract from one another, the resulting deflection angle is $$\alpha = \alpha_M - \alpha_E$$

together with the corresponding beam displacement (from an "undeflected" beam impact point 8 to an impact point 10 in plane 7 of FIG. 1):

$$A = \alpha \cdot L = \alpha_M L_M - \alpha_E L_E = (\alpha_M - \alpha_E)L$$

If the deflecting fields lie separated one behind the other in the beam direction ($L_M \neq L_E$), the excursion of the beam can be calculated as the difference of the excursions from point 8 to point 9 and from point 9 to point 10 in plane 7 of FIG. 2, or from point 8 to point 11 and from point 11 to point 10 in plane 7 of FIG. 3:

$$A = \alpha_M L_M - \alpha_E L_E$$

The excursions A are now subjected to fluctuations $\Delta A$, generally caused by the chromatic deflection-aberrations in the event of a fluctuation $\Delta U$ in the acceleration voltage. In the case of electrons, a chromatic deflection-aberration which is continuously present, occurs because the energy distribution of the electrons emitted by the cathode has a finite width $e\Delta U_{em}$ of the order of magnitude of 1 eV, which is equivalent to a corresponding fluctuation in the acceleration voltage.

It can now be shown, that there is a specific ratio between the magnitudes of the deflection angles at which the fluctuations $\Delta A$, and thus the chromatic deflection-aberrations, disappear. These spectial conditions are disclosed in the following text and they contain design instructions for the construction of a chromatically corrected deflection system. Deflection systems constructed according to such design instructions are the subject of the present invention. The pertinent factors will now be disclosed.

It can be inferred, from the above equations for $\alpha_E$ and $\alpha_M$, that the following changes in the deflection angles will occur in the event of a change $e\Delta U$ in the particle energy:

$$\Delta \alpha_E = -\alpha_E (\Delta U / U)$$

$$\Delta \alpha_M = -\tfrac{1}{2}\alpha_M (\Delta U / U)$$

The corresponding changes $\Delta A$ in the beam excursion A are given, for the arrangement with superposed deflection systems according to FIG. 1, by the equation $$\Delta A = (\alpha_E - \tfrac{1}{2}\alpha_M)(\Delta U / U)$$

and in the case of separate deflection systems according to FIGS. 2 and 3, by the equation $$\Delta A = (\alpha_E L_E - \tfrac{1}{2}\alpha_M L_M)(\Delta U / U)$$

A chromatically corrected deflection system is now characterized, according to the invention, by the validity of the following equation for the deflection angles, if the electric and magnetic deflecting fields are superposed as in FIG. 1:

$$\alpha_E = \tfrac{1}{2}\alpha_M$$

In the case of a separated arrangement of the deflecting fields, corresponding to FIG. 2 or FIG. 3, the deflection angles must satisfy the following condition for achieving the correction of the chromatic deflection-aberrations according to the invention:

$$\alpha_E = \tfrac{1}{2}(L_M / L_E)\alpha_M$$

Under these conditions, the chromatic aberration of the electric deflecting field exactly compensates the chromatic aberration of the magnetic deflecting field, and, for this purpose, the electric deflection must be directed in opposition to the magnetic deflection, so that the following equation holds for the resulting deflection angle, in the case of the arrangement with superposed deflection systems according to FIG. 1:

$$\alpha = \alpha_M - \alpha_E = \tfrac{1}{2}\alpha_M$$

The resulting deflection angle, according to the following equation, is obtained by means of separated deflection systems according to FIG. 2 or FIG. 3

$$\alpha = \alpha_M - \alpha_E = \tfrac{1}{2} \alpha_M \frac{2L_E - L_M}{L_E}$$

Figure 6:
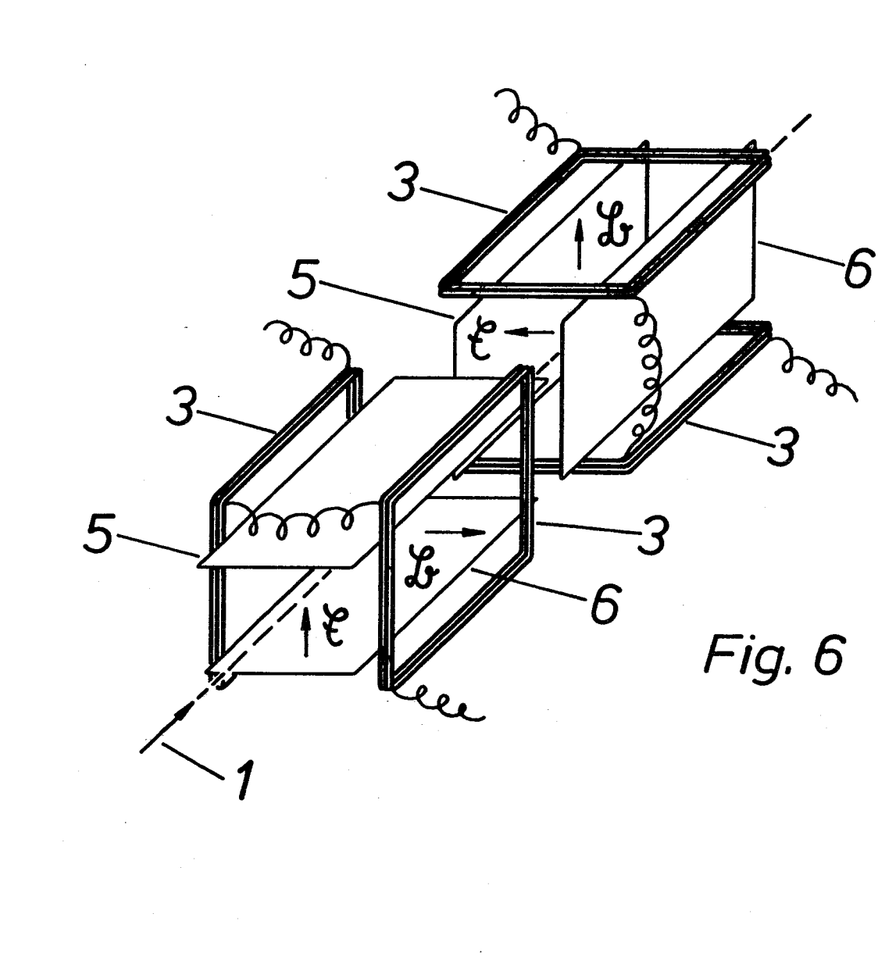
FIGS. 6 to 8 show arrangements with two deflection systems having planes of deflection rotated through 90° relative to one another.

The preceding statements represent a design instruction for the construction and mode of operation of a chromatically corrected deflection system, and particularly for the linear deflection within a plane containing the undeflected beam direction and along a line within the surface of the specimen. If it is desired to deflect the beam, in two dimensions, across the entire specimen surface, a second chromatically corrected electric-magnetic deflection system is employed in a conventional manner which is known per se, the deflecting plane of this system being rotated through 90° relative to the deflecting plane of the first system, the direction of the undeflected beam being the rotation axis. In FIG. 6, an embodiment of such a system is shown which is composed of two chromatically corrected deflection systems of the type shown in FIG. 1. (The same reference numbers have been employed in FIG. 6 as already used for the corresponding parts in FIG. 1).

Figure 7:
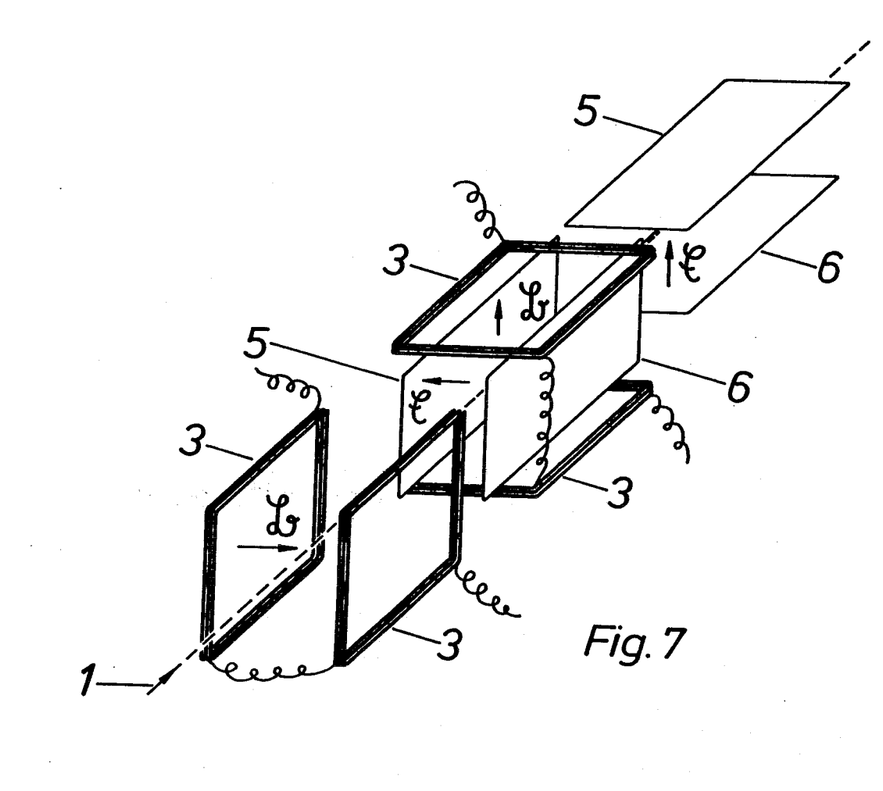
Figure 8:
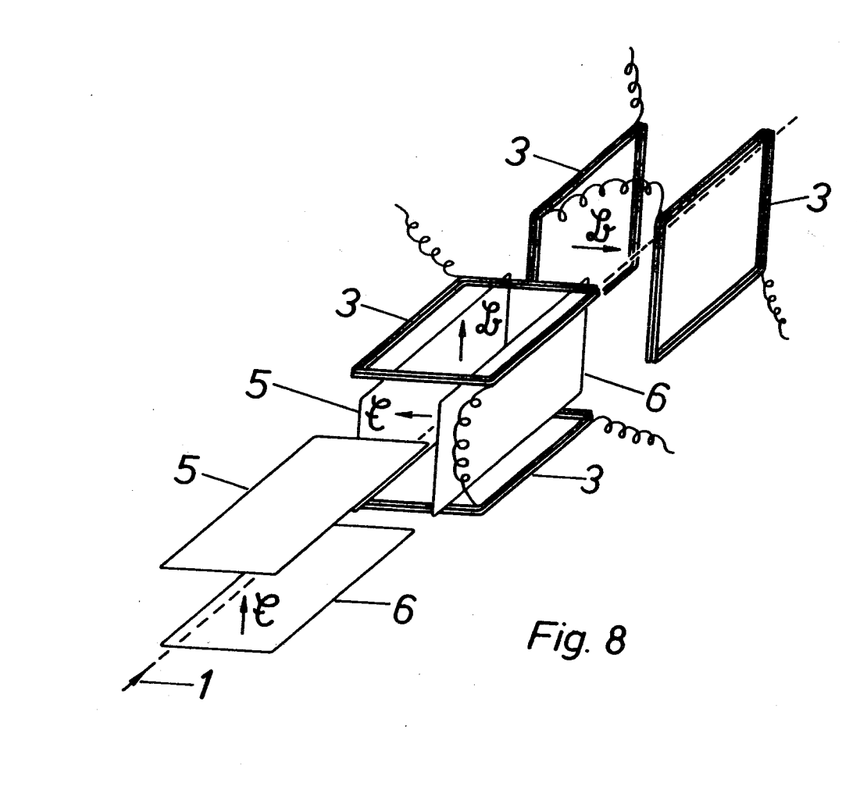

If two chromatically corrected deflection systems are used simultaneously in the described manner with deflection planes rotated by 90° relative to one another, it is in no way necessary, that the two chromatically corrected deflection systems be constructed in the same way. It can, for example, be advantageous, for reasons of space, to arrange a superposed deflection system according to FIG. 1, rotated by 90° about the beam axis, between the two deflection systems according to FIG. 2 or 3. Embodiments of systems of this kind are shown in FIGS. 7 and 8. Hereby, in FIG. 7, a system according to FIG. 1 is placed between the separate deflection units of a system according to FIG. 2. In FIG. 8, the system according to FIG. 1 is positioned between the two separate deflection units of a system according to FIG. 3. (The same reference numbers are used for corresponding parts in all FIGS. 1 to 3 and 6 to 8).

Another important point is that the particular configuration of the deflecting fields plays no part in achieving the chromatic correction. In the formulae for $\Delta\alpha_E$ and $\Delta\alpha_M$, given above, the design-related configuration parameters no longer appear. The deflecting fields (or one of them) can thus be made short and correspondingly strong, or long and correspondingly weak—this is quite without consequence as far as achieving the correcting effect is concerned. It is also unnecessary for the deflecting fields to be uniform to any extent, as could be inferred from the deflection systems represented in FIGS. 4 and 5 simply as an illustrative example. For instance, the electric deflecting plates according to FIG. 4 could definitely be allowed to diverge, wedge-like, in the beam direction, as is known to have been found advantageous for example with the deflecting plates of cathode-ray oscillographs. In order to define the dimensions of the chromatically corrected deflection system, it is nevertheless necessary to know the virtual bending point of the beam, the distance of which from the working plane enters into the design formulae.

It must furthermore be explicitly pointed out that, in the technology of particle-beam apparatus, there is nothing new per se in the use of crossed electric and magnetic deflecting fields, and in the WIEN filter this method serves for the generation or for the selection of an electron beam which is as far as possible monochromatic. In the WIEN filter, however, the electric and the magnetic deflection angles are set in such a manner that they have the same magnitude and are directed in mutual opposition, so that the filter is of the direct-vision type and has an appreciable chromatic deflecting mirror. Beams with a velocity deviating with reference to the nominal energy are deflected out of the axis and are trapped by screens. The intended application of the WIEN filter is thus completely opposite to the purpose of the present invention.

Yet another system has become known, which is intended to compensate the chromatic deflecting error in an electron-beam lithography apparatus (E. Munro (1975): Journ. Vac. Sci. Technol. 12 No. 6; pages 1170–1173). Here, a magnetic deflection system is placed at a particularly suitable position in the magnetic field of a magnetic electron lens. The deflection beams thus pass through a part of the lens field more remote from the axis. The chromatic deflecting error then alters the paths of the electrons exactly in the manner that the change in the part of the lens refracting power, produced by this arrangement and acting on these beams, together with the chromatic variation of the refracting power of the magnetic lens per se, exactly produces such an additional deflection that the impact point of the electron beam on the preparation (in this case, the semiconductor plate, the wafer) remains unaltered. Thus, in this case, an electric deflecting field is not employed. In fact, this last-mentioned method, representing the state of the art, is not so clearly understandable with regard to its physical mode of operation, as the chromatically corrected deflection system according to the present invention. In comparison, the deflection system according to the invention also offers the technical advantage that it affords considerable freedom with regard to the design arrangement.

Another procedure for the achromatic magnetic deflection of a particle beam, which has become known, relates to the deflection, by focussing, by the comparatively very large fixed angle of 270°, a chromatic correction being achieved by using a plurality of suitably shaped sector-magnets. This procedure is described in German Offenlegungsschrift No. 2,402,388. Again, no additional electric field is used in this case. Furthermore, the system mentioned is not subject to such onerous requirements with regard to the degree of collimation and chromatic correction as for electron-beam lithography, because the 270°-deflection system is concerned only with producing a more or less concentrated spot of electrons in order to create an X-ray source for therapy applications. Additionally, the deflection is produced only in one dimension, the deflecting component normal thereto is missing, and, moreover, the deflection angle is not varied in accordance with a scan.

In the foregoing, the chromatically corrected deflection system according to the invention was discussed from the point of view of its application to electron-beam lithography. However, it can also be employed, in a correspondingly adapted manner, in other types of particle-beam equipment, such as particle-beam microscopes, particle-beam diffraction apparatus and particle-beam interferometers, and in these applications can, for example, be used for adjusting the beam.

The preceding statements are based on the implied assumption, that the kinetic energy of the particles forming the particle radiation is small in comparison to their rest energy. This can be expressed mathematically in the following manner:

$$eU < < m_o c^2$$

In this formula, U denotes the acceleration voltage, e the elementary electrical charge $e = 1.602 \times 10^{-19}$ Asec, $m_o$ denotes the rest mass of the particles and $c = 2.998 \times 10^8$ m/sec the velocity of light in vacuo. For example, $m_o c^2 = 510$ keV for electron beams, and since, in electron-beam lithography, the acceleration voltage U lies under 50 kV, the above considerations, which are based on classical physics, also apply quantitatively in the case of electron-beam lithography equipment.

In the case of higher beam voltages, such as are employed, for example, in high-voltage electron microscopes with acceleration voltages of the order of magnitude of 1 MV, a treatment must be formulated within the frame of the theory of relativity.

In this case, the deflection angle can, for the electric deflection system, be written in the following manner:

$$\alpha_{E,r} = \frac{1}{2}(u/U)(1/d)\cdot\psi(U)$$

where $$\psi(U) = \frac{U + \frac{m_o c^2}{e}}{\frac{1}{2}U + \frac{m_o c^2}{e}}$$

represents a relativistic correction factor. In the above "classical" acceleration voltage range $eU < < m_o c^2$, this factor has the value $\psi = 1$. With increasing acceleration voltage, entering more and more into the relativistic range, $\psi$ also increases steadily, until it reaches the limiting value $\psi = 2$ at extremely high voltages $eU > > m_o c^2$.

The corresponding chromatic aberration of the deflection angle has the form $$\Delta\alpha_{E,r} = -\alpha_{E,r}(\Delta U/U)\cdot\phi(U)$$

The relativistic correction factor $$\phi(U) = 1 - \frac{\frac{1}{2}\frac{m_o c^2}{e}U}{\left(\frac{1}{2}U + \frac{m_o c^2}{e}\right)\left(U + \frac{m_o c^2}{e}\right)}$$

has the value $\phi = 1$ at classical and at very high acceleration voltages $U > > m_o c^2/e$, while it decreases somewhat in the already relativistic intermediate range approximating to 1 MV and assumes a minimum $\psi = 0.83$ when $U = \sqrt{2}\ m_o c^2/e$.

When a magnetic deflection system is used, the deflection angle is given by $$\alpha_{M,r} = \mu_o \sqrt{\frac{e}{2m_o}}\ \frac{NJ}{\sqrt{U}} \cdot \frac{h}{b} \cdot \psi(U)$$

The relativistic correction factor $$\psi(U) = \frac{1}{\sqrt{1 + \frac{eU}{2m_o c^2}}}$$

has the value $\psi = 1$ for electrons in the classical beam voltage range $U < < 0.5$ MV. It decreases continuously as the acceleration voltage increases and assumes, for example, the value $\psi = 0.5$ when $U = 3$ MV and $\psi = 0.1$ when $U = 100$ MV.

For the magnetic deflection system, the amount by which the deflection angle is altered by the chromatic deflecting error is given by the formula $$\Delta\alpha_{M,r} = -\tfrac{1}{2}\alpha_{M,r}(\Delta U/U)\cdot\mu(U)$$

The relativistic correction factor used here $$\mu(u) = \frac{1 + \frac{eU}{m_0 c^2}}{1 + \frac{eU}{2 m_0 c^2}}$$

varies from $\mu = 1$ in the classical voltage range $U \ll m_0 c^2/e$ up to near the limiting value $\mu = 2$ for very high beam voltages $U \gg m_0 c^2/e$.

Starting from these equations, conditions can now be specified, corresponding exactly to what is stated above, which must, according to the invention, form the basis for the construction and mode of operation of chromatically corrected deflection system functioning in the relativistic particle energy range $U \approx m_0 c^2/e$.

For an arrangement according to FIG. 1, having coincident and superposed electric and magnetic deflection systems, it is found that the mutually opposed deflection angles $\alpha_{M,r}$ and $\alpha_{E,r}$ must respect the following condition in order to achieve the chromatic correction:

$$\alpha_{E,r} = \tfrac{1}{2}\alpha_{M,r}\omega(U)$$

In this relationship, $\omega(U)$ represents a relativistic correction factor, defined in the following manner:

$$\omega(U) = \frac{\mu(U)}{\phi(U)}$$

$$= \frac{\left(\frac{m_0 c^2}{e} + U\right)^2}{\left(\frac{m_0 c^2}{e}\right)^2 + \frac{m_0 c^2}{e} U + \tfrac{1}{4} U^2}$$

Similar to the case of $\mu(U)$, the range of values for $\omega(U)$ extends from $\omega = 1$, for the classical range of acceleration voltage $U \ll m_0 c^2/e$, to $\omega = 2$ for beams with extremely high energies, for which $U \gg m_0 c^2/e$. In the mid-range approximating to 1 MV, $\omega(U)$ merely increases rather more quickly than $\mu(U)$. The resulting deflection angle is thus given by $$\alpha_r = \alpha_{M,r} - \alpha_{E,r} = \alpha_{M,r}[1 - \tfrac{1}{2}\omega(U)]$$

At very high beam energies, at which $\omega(U)$ closely approaches its limiting value 2, a chromatically corrected deflection system according to FIG. 1 is accordingly unusable, because the resulting deflection angle tends to zero.

If, for example electron beams which have been accelerated with $U = 1$ MV, are deflected with the aid of a deflection system corrected with respect to the chromatic deflecting error according to FIG. 1, only 10% of that deflection angle is achieved, using the precisely specified current in the deflecting coils, which the magnetic deflection system would produce on its own, that is, without being overlaid by the associated electric deflecting field. In the case of a beam voltage of $U = 3$ MV, the deflection angle of the corrected system even decreases to only 2% of that particular deflection angle, which would be produced by the magnetic deflection system on its own, operated in the same manner.

In the relativistic case, the magnetic deflection is again cancelled out, to a significant extent, by the superposed electric deflection, in a deflection system corrected for chromatic errors according to FIG. 1. Separately, both deflections are thus approximately equally large and are much larger than the resulting deflection angle.

As acceleration voltage increases, limits are thus set to the electric deflection of electron beams, with regard to the achievable deflection angles, so that it becomes increasingly more difficult to apply the required deflection voltages, which are also increasing, to the deflecting plates. Finally, reaching the sparkover voltage sets a physical limit which cannot be overcome. In the case of the magnetic deflection, this limitation occurs, under practical conditions, on reaching magnetic saturation in the available ferromagnetic materials and only becomes noticeable with comparatively much more highly accelerated electrons.

An arrangement according to FIG. 2 or 3 is no more advantageous for these very high beam energies. For these energies, the relativistically correct condition for the relationship which the deflection angles must fulfill in order to achieve the chromatic correction is $$\alpha_{E,r} = \tfrac{1}{2}\alpha_{M,r}(L_M/L_E)\cdot\omega(U)$$

The resulting deflection distance on the preparation plane is then given by the expression $$A_r = \alpha_{M,r} L_m - \alpha_{E,r} L_E = \alpha_{M,r} L_M[1 - \tfrac{1}{2}\omega(U)]$$

Deflection systems, corrected for chromatic aberrations according to the invention, can accordingly be used only with those particle beams, in which the energy conferred on the particles by the acceleration voltage does not exceed a few multiples of the rest energy of the particles.

The invention may be embodied in other specific forms without departing from the spirit or essential characteristics thereof. The embodiments are therefore to be considered in all respects as illustrative and not restrictive.

What is claimed is:

1. A chromatically corrected deflecting device for particle-beam equipment, particularly electron-beam equipment arranged to irradiate locations lying in or in close proximity to a common or working plane which is oriented perpendicular to the axis of said equipment, wherein an electric deflecting field and a magnetic deflecting field are simultaneously employed for the deflection of a beam, the two deflecting fields being normal to each other and being oriented relative to each other in such a manner that the beam deflections due to the associated deflecting fields occur in one and the same plane, namely in the plane containing the undeflected beam, and wherein the electric deflection is at the same time directed in opposition to the magnetic deflection, and wherein the ratio of the magnitude of the electric deflection angle to the magnitude of the magnetic deflection angle remains at a constant value which is independent of the resulting total deflection angle and is chosen such that the chromatic aberrations affecting the deflections due to the individual fields exactly compensate each other with reference to their effect on the beam position in said working plane, the constant value of the ratio of the magnitudes of the deflection angles being uniquely determinable as a function of at least one of (1) the distance of the deflecting fields from the working plane and (2) the energy and rest mass of the particles to be deflected by particle-optical means.

2. A chromatically corrected deflecting device for particle-beam equipment as set forth in claim 1, wherein the two deflecting fields forming the deflecting system, one field being electric and the other magnetic, are mutually superposed.

3. A chromatically corrected deflecting device for particle-beam equipment as set forth in claim 1, wherein the two deflecting fields forming the deflecting system, one field being electric and the other magnetic, are arranged one behind the other, seen in the beam direction.

4. A chromatically corrected deflecting device for particle-beam equipment as set forth in claim 1, wherein the constant ratio $$\frac{\alpha_E}{\alpha_M} = \frac{1}{2} \frac{\left(\frac{m_o c^2}{e} + U\right)^2}{\left(\frac{m_o c^2}{e}\right)^2 + \frac{m_o c^2}{e} U + \frac{1}{2} U^2}$$

is used for the ratio of the magnitude $\alpha_E$ of the electric deflection angle to the magnitude $\alpha_M$ of the magnetic deflection angle, $m_o$ denoting the rest mass of the particles forming the beam, e denoting the elementary electrical charge, c denoting the velocity of light in vacuo and U denoting the voltage by which the particles have been accelerated before the deflection.

5. A chromatically corrected deflecting device for particle-beam equipment as set forth in claim 1, wherein the constant ratio $$\frac{\alpha_E}{\alpha_M} = \frac{1}{2} \frac{L_M}{L_E} \frac{\left(\frac{m_o c^2}{e} + U\right)^2}{\left(\frac{m_o c^2}{e}\right)^2 + \frac{m_o c^2}{e} U + \frac{1}{2} U^2}$$

is used for the ratio of the magnitude $\alpha_E$ of the electric deflection angle to the magnitude $\alpha_M$ of the magnetic deflection angle, $L_E$ denoting the distance of the virtual bending point of the beam, due to the electric deflection system, from the working plane, $L_M$ denoting the distance of the virtual bending point of the beam, due to the magnetic deflection system, from the same working plane, $m_o$ denoting the rest mass of the particles forming the beam, e denoting the elementary electrical charge, c denoting the velocity of light in vacuo and U denoting the voltage by which the particles have been accelerated before the deflection.

6. A chromatically corrected deflecting device for particle-beam equipment as set forth in claim 1, comprising a second deflecting device, these devices being chromatically corrected per se and their magnetic fields being rotated through 90° relative to each other.

7. A chromatically corrected deflecting device for particle-beam equipment as set forth in claim 6, wherein at least one of the two deflecting devices has its deflecting fields arranged one behind the other, seen in the beam direction, and wherein between the electric and magnetic deflecting fields of said one deflecting device there is arranged at least one of the deflecting fields of the other deflecting device rotated through 90° relative to the said one deflecting device.

* * * * *